United States Patent [19]

Wolf et al.

[11] 4,240,059
[45] Dec. 16, 1980

[54] CURRENT DIVIDER FOR A CURRENT SENSING TRANSDUCER

[75] Inventors: Joachim E. Wolf; Philip F. Locke, Jr., both of Monroeville, Pa.

[73] Assignee: Westinghouse Electric Corp., Pittsburgh, Pa.

[21] Appl. No.: 27,432

[22] Filed: Apr. 5, 1979

[51] Int. Cl.³ .............................................. H01C 7/00
[52] U.S. Cl. .................................................... 338/49
[58] Field of Search ................. 338/49, 120, 328, 333, 338/334; 324/76 R, 99 D, 142, 126, 127

[56] References Cited

U.S. PATENT DOCUMENTS

| | | | |
|---|---|---|---|
| 1,084,721 | 1/1914 | Willis | 338/49 X |
| 2,915,707 | 12/1959 | Bradstock et al. | 324/127 |
| 3,372,334 | 3/1968 | Fonoglio et al. | 324/126 |

Primary Examiner—C. L. Albritton
Attorney, Agent, or Firm—E. L. Pencoske

[57] ABSTRACT

A current divider having two major current paths and a shunting current path is disclosed. The shunting current path connects the two major current paths at a point on each major current path such that the shunting current path connects points which have slightly different voltage potentials. This slight difference in voltage potentials causes a current to flow in the shunting current path. The current that flows in the shunting current path is a predetermined fraction of the total current and is primarily dependent on the difference in voltage potentials which is a function of the location of the shunting current path. The current that flows in the shunting current path is substantially independent of the ratio of the cross-sectional areas and/or the inverse lengths of the current paths in that for a given cross-sectional area of the shunting current path various values for the current split off may be obtained by varying the location of the shunting current path.

8 Claims, 3 Drawing Figures

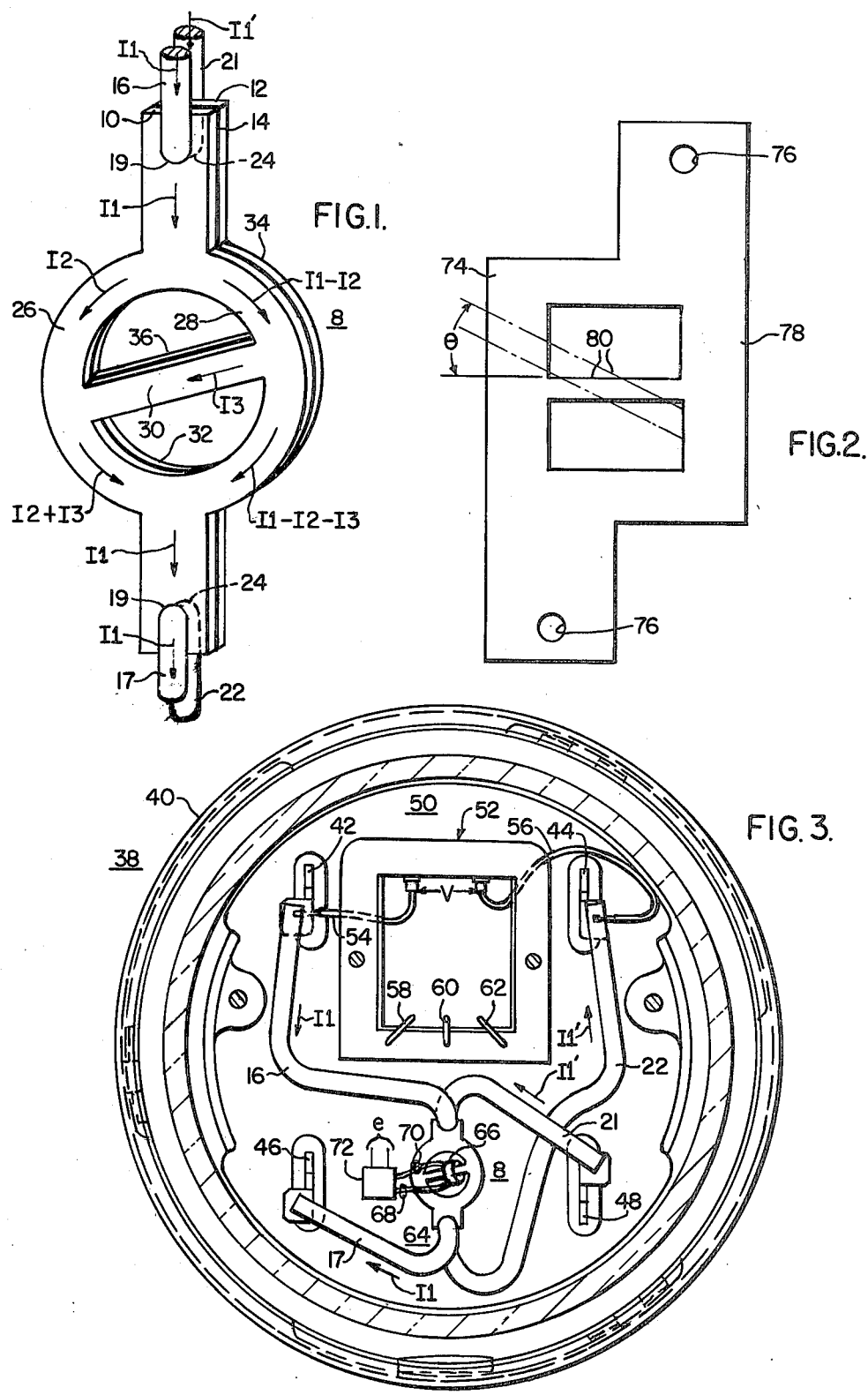

CURRENT DIVIDER FOR A CURRENT SENSING TRANSDUCER

BACKGROUND OF THE INVENTION

1. Field of the Invention

This invention relates to current dividers used in conjunction with a current sensing transducer of an electric energy measuring meter. More particularly, this invention relates to those current dividers which provide a fixed and predetermined fractional value of a current to be sampled independently of the ratio of the cross-sectional areas of the current-carrying members.

2. Description of the Prior Art

It is desirable in countless applications to sample the current flowing in a conductor. One such application is the measurement of electrical energy quantities such as kilowatts, kilowatt hours, volt ampere hours, etc.

In typical electrical energy measurements at an electric utility customer location, line current varies typically from one-half ampere to 200 amperes or in a current variation ratio of approximately 1 to 400. Current instrument transformers that are required to produce low level output signals from the aforementioned widely-varying current input often require structural arrangements which are of substantial size and cost. This is due to the fact that in a current transformer, the ampere turns of the primary must equal the ampere turns of the secondary. Since maximum current levels of the primary may reach 200 amperes, the secondary winding size becomes substantial in order to produce linear low level output signals. One solution to this problem is to use a current sensing transducer in place of a current transformer.

One example of a current-sensing transducer is disclosed in U.S. Patent Application Ser. No. 923,620 for a "Current Sensing Transducer For Power Line Current Measurements", which is assigned to the assignee of this invention. The current-sensing transducer includes a conductive current divider having a branch path for conducting a fractional current proportional to the current to be sensed. This branch path is used as the primary winding of a single turn compensated transformer having two secondary windings. An amplifier circuit controls the current input to one of the secondary windings in response to the output of the other of the secondary windings such that the flux in the transformer core due to the branch current is virtually compensated. The secondary winding current is a measure of the current flowing in the branch path. Since the current flowing in the branch path is a fixed proportion of the current to be sensed, the secondary winding current is a measure of the current to be sensed.

It is apparent from the foregoing that current-sensing transducers operated in conjunction with a current divider are of substantially less size and cost than a conventional current transformer. A typical current divider which may be used with a current sensing transducer is disclosed in U.S. Pat. No. 2,915,707 for a "Current Measuring Reactor Arrangement" which discloses a current divider that is insensitive to ambient electromagnetic fields. A conductor is provided with an aperture and a conductive shunt of reduced cross-sectional area. It is an inherent feature that the current flowing in the conductive shunt is a ratio of the cross-sectional area of the conductive shunt and the cross-sectional area of the other conductive paths.

As seen from the above example current dividers typically utilize the principle that a fractional current may be produced by providing two or more current paths having a ratio of cross-sectional areas, or inverse lengths, which are the same fraction as that desired for the sample current. For example, if a current in a branch path is to be 1/40 of the current in a major path, the cross-sectional area, or inverse length, of the branch path must be 1/40 of the cross-sectional area, or inverse length, of the major path. However, problems are encountered when extremely small currents are to be split off from a substantially large current or if the overall physical size of the current divider is to be extremely small. In these cases, by providing the proper ratio of cross-sectional areas, or inverse lengths, the shunting or branch path becomes so small that it is no longer structurally sound. In addition, small branch paths may become subject to self-heating causing thermal gradients thereby destroying the proportionality of the current divider.

SUMMARY OF THE INVENTION

This invention is a new and improved current divider for providing a fractional value of a current to be measured. A first major current path and a second major current path are electrically in parallel and are connected between opposite terminal ends. A shunting current path extending between a first point on the first major current path and a second point on the second major current path having the same voltage potential as the first point will conduct no current. This is defined as a null position for the shunting current path. When the shunting current path is extended between points slightly displaced from the points defining the null position, the small potential difference between the first point and the second point causes a relatively small fractional value of the current to be sampled to flow in the shunting current path irrespective of its relatively large cross-sectional area and/or its short length compared with the major current paths. The current split off is independent of the ratio of the cross-sectional areas of the current paths in that for a given cross-sectional area of the shunting current path various values for the current split off may be obtained by varying the degree of displacement from the null position. This independence allows the overall size of the current divider to be reduced while maintaining the structural rigidity of the shunting current path. Also, the present invention has improved thermal characteristics and is capable of maintaining the proportionality of the current split-off over a wide range of input currents.

BRIEF DESCRIPTION OF THE DRAWINGS

FIG. 1 is a current divider constructed in accordance with the present invention;

FIG. 2 is an alternate embodiment of a current divider constructed in accordance with the present invention; and FIG. 3 is a front elevational view with parts broken away of an AC electric energy meter including a current divider constructed in accordance with the present invention.

DESCRIPTION OF THE PREFERRED EMBODIMENTS

FIG. 1 is an illustration of a current divider 8 constructed in accordance with the present invention. The current divider 8 is comprised of a first current divider 10 and a second current divider 12 separated by a layer of insulation 14. Thus, the current divider 8 is adapted for use in a three-wire system having two hot wires. It is to be noted that the current divider 8 shown in FIG. 1 may be adapted to accommodate any number of hot wires carrying currents to be sampled.

The current divider 8 will now be described in more detail. The first current divider 10 is series connected at opposite terminal ends 19 to conductors 16 and 17. A first major current path 26, semicircular in shape, extends between opposite terminal ends 19. A second major current path 28, semicircular in shape, extends between opposite terminal ends 19. The first major current path 26 and the second major current path 28 are electrically in parallel and together form a circular conductive path. The first major current path 26 and the second major current path 28 have equal cross-sectional areas of 0.056 square inches (0.361 cm²) and equal lengths of 1.98 inches (5.029 cm). A first shunting current path 30 extends between a first fixed and predetermined point on the first major current path 26 and a second fixed and predetermined point on the second major current path 28. The first and second points are chosen such that there is a small voltage potential difference between the two points. This small potential difference causes a current to flow which is only a small fraction of the current to be sampled despite the relatively equal cross-sectional areas or inverse lengths of the current paths. The shunting current path 30 has a cross-sectional area of 0.028 square inches (0.181 cm²) which is comparable to the cross-sectional areas of the other current paths for the purpose of maintaining structural rigidity and minimizing thermal gradients.

In operation, the current I1 which is to be sampled flows from conductor 16, through the first current divider 10, and into the conductor 17. Since the first major current path 26 is electrically in parallel with the second major current path 28, for every point on the first current path 26, a point on the second current path 28 may be found which is at the same voltage potential. These sets of points, i.e. one point on the first major current path 26 and one point on the second major current path 28, each define a null position of the first shunting current path 30. That is, if the shunting current path 30 connects points of exactly equal voltage potential no current will flow therein.

In the present invention, since the first major current path 26 is symmetric with the second major current path 28 locating the first shunting current path 30 horizontally (with respect to the opposite terminal ends 24) from the first to the second major current path defines a null position of the shunting current path 30. No current flows in the shunting current path 30 since points of exactly equal voltage potential are connected. It is an important feature of this invention to note that displacement of the shunting current path 30 from this null horizontal position will cause the shunting current path 30 to connect points of slightly different voltage potentials. This slight difference in voltage potentials will cause a current I3 to flow in the shunting current path 30. The current I3 that flows in the shunting current path 30 is dependent primarily on the potential difference of the points that it connects. The current I3 is substantially independent of the ratio of the cross-sectional areas or lengths of the current paths in that the current I3 may be increase by increasing the displacement of the shunting current path 30 from the null position or decreased by decreasing the displacement from the null position so long as the displacement from the null horizontal position is relatively small.

The relationship between the currents flowing in the first current divider 10 may be described using Kirchhoff's current law. The current I1 flowing from terminal 19 is the same current that flows in the conductor 16. The current which flows in the top portion of the first major current path 26 is current I2. The current flowing in the top portion of the second major current path 28 is I1 minus I2. The current I3 flowing in the first shunting current path 30 flows from a point of high voltage potential on the second major current path 28 to a point of lower voltage potential on the first major current path 26. The current flowing in the lower portion of the second major current path 28 is the current I1 minus I2 minus I3. The current flowing in the lower portion of the first major current path 26 is I2 plus I3. The current flowing into opposite terminal end 19 is the current I1 minus I2 minus I3 from the second major current path 28 and the current I2 plus I3 from the first major current path 26. The combination of these two currents yields I1.

The second current divider 12 is series connected at opposite terminal ends 24 to conductors 21 and 22. The current flowing in the conductors 21 and 22 is I1'. The second current divider 12 is symmetrical with the first current divider 10. The second current divider 12 has a third major current path 32, semicircular in shape, extending between opposite terminal ends 24. A fourth major current path 34, semicircular in shape, extends between opposite terminal ends 24. A second shunting current path 36 extends between a fixed and predetermined point on the third major current path 32 and a fixed and predetermined point on the fourth major current path 34, the two points having slightly different voltage potentials. The foregoing discussion regarding the structural and functional characteristics of the first current divider 10 is applicable to the second current divider 12.

FIG. 2 is an alternate embodiment of a current divider constructed in accordance with the present invention. A first major current path 74 extends between opposite terminal ends 76. A second major current path 78 in parallel with the first major current path 74 extends between opposite terminal ends 76. A shunting current path 80, shown in broken lines, extends between points of equal voltage potential defining a null position for the shunting current path 80. The shunting current path 80, shown in solid lines, is slightly displaced from the null position such that points of slightly different voltage potentials are connected. For a given cross-sectional area of the shunting current path 80, the current flowing therein is dependent on the degree of displacement θ from the null position and independent of the ratio of the cross sectional areas of the current paths. That is, holding the cross-sectional area of the shunting current path 80 constant, the current flowing therein may be increased or decreased by increasing or decreasing, respectively, the angle of displacement θ from the null position.

Referring to FIG. 3, an AC electric energy or watthour meter 38 is partially shown including a current divider 8 made in accordance with the present invention. The meter 38 is intended for use in one preferred embodiment with an AC electric energy measuring circuit for providing indications of the consumption of alternating current energy supplied to a customer location by an electric power producer for such purposes as billing of the customer. Such electronic AC electric energy measuring circuits may include circuits described in U.S. Pat. Nos. 3,764,908; 3,864,631; and 4,077,061, all assigned to the assignee of this invention.

The meter 38 is intended for connection between a 60 Hz. source of electrical energy and a load, not shown, for measurement of the consumption of electrical energy by the load. It is well known that the electrical energy measured in kilowatt hours is defined by a line voltage V and a line current I. The meter 38 includes a housing 40 conventionally used for electromagnetic or induction type watthour meters in one preferred embodiment. Four meter blade terminals 42, 44, 46, and 48 carried in a conventional manner by a base 50 of the housing 40 are adapted for mounting at mating socket terminals, not shown, of a meter mounting box in a well-known manner. A typical electric power service includes a three-wire single-phase connection having two hot conductors and one neutral conductor. The top blade terminals 42 and 44 are thus arranged to be connected in parallel to a pair of hot wire line conductors also not shown. The pair of hot line conductors have the voltage V, typically 240 volts, 60 Hz., thereacross with the line currents I1 and I1' passing in series with two power line conductors also not shown. Thus, the line voltage V is developed across the blade terminals 42 and 44 and the line current I1 passes in series through the pair of blade terminals 42 and 46 and then also in series with the pair of terminals 44 and 48 when the current-sensing transducer 12 is connected within the meter 38 as described hereinafter.

Heavy current-carrying conductors 16 and 17 are connected to the meter terminals 42 and 46, respectively, for connecting the current divider 8 in series therewith. Similarly, the heavy current-carrying conductors 21 and 22 are connected to the terminals 48 and 44, respectively, for further connecting the current divider 8 in series with the terminals 44 and 48. Thus, the current divider 8 is connected in series with the two directions of the flow of line currents I1 and I1' in the conductors 16, 17 and 21, 22. The direction of flow of the line currents I1 and I1' through the current divider 8 is the same, as shown in FIG. 1. It is to be understood that the total line current I is equal to I1 plus I1'.

A voltage sensing transducer 52, not forming a part of this invention, is shown in FIG. 3 having a primary winding connected at primary wire leads 54 and 56 to the blade terminals 42 and 44. The line voltage V is thereby applied across the primary of the voltage transducer 52. A center tapped secondary winding thereof has output wire leads 58, 60, and 62 providing an analog signal proportional to the line voltage V. The analog signal provides one of the input signals for an AC energy measuring circuit producing energy computations from line voltage and line current components. A second input signal to the measuring circuit is provided by a current sensing transducer 64 described hereinafter.

The current-sensing transducer 64, not forming a part of this invention, is of the type shown in U.S. Patent Application Ser. No. 923,620. The current-sensing transducer 64 is composed of a compensated transformer arrangement 66 and an amplifier circuit 72. The compensated transformer arrangement 66 is mounted around the first shunting current path 30 and the second shunting current path 36 such that the shunting current paths act as a single turn primary winding for the compensated transformer. The compensated transformer arrangement 66 carries a first and sensing secondary winding 68 and a second and compensating secondary winding 70. The sensing 68 and compensating 70 secondary windings are connected to an amplifier circuit 72. The sensing secondary winding 68 senses the magnetic flux in the compensated transformer's core and provides a signal which is the input signal for the amplifier circuit 72. The amplifier circuit 72 provides an output current responsive to the input signal of the first and sensing secondary winding 68. This output current flows in the second and compensating secondary winding 70 and is used to drive the magnetic flux in the compensated transformer's core to zero. A voltage derived from the current flowing in the second compensating secondary winding 70 is an analog signal proportional to the total current I. The analog signal e is the second input signal to the AC electric energy measuring circut, not shown, as noted hereinabove.

The total current flowing in conductors 16, 17 and 21, 22 may vary from one-half to 200 amperes. For the current-sensing transducer 64 to be effective it is used in conjunction with the current divider 8 which provides a total current flowing in the shunting current paths 30 and 36 of five amperes when I is 200 amperes. This is accomplished by displacing the first shunting current path 30 of the first current divider 10 substantially eight degrees from a null position. Choosing the midpoints of the first major current path 26 and the second major current path 28 as the null position, the first shunting current path 30 connects a point substantially eight degrees below and a point substantially eight degrees above the midpoints of the first and second major current paths, respectively. Similarly, the third shunting current path 32 connects a point substantially eight degrees below and a point substantially eight degrees above the midpoints of the third and fourth major current paths, respectively. A current divider of this configuration may be stamped from a sheet of any suitable conductive material such as copper or aluminum.

Finally, it is to be noted that the foregoing description of the current divider 8 is provided as an illustration and is not intended as a limitation. It is anticipated that current dividers of other configurations may be devised that fall within the scope of the present invention.

Briefly summarizing, the present invention is a current divider having two major current paths and a shunting current path. The shunting current path connects the two major current paths at points that are at slightly different voltage potentials. The current that is caused to flow in the shunting current path is primarily dependent on the difference in voltage potentials which is a function of displacement of the current path and is substantially independent of the ratio of the cross-sectional areas or the inverse lengths of the current paths. That is, for a given cross-sectional area of the shunting current path various values for the current flowing therein may be obtained by varying the location of the shunting current path. The shunting current path therefore has a cross-sectional area comparable to the cross-sectional areas of the major current paths. Also, the present invention may be adapted to accommodate a system having any number of hot conductors by combining the same number of current dividers in insulated relationship with one another.

What is claimed is:

1. A current divider formed by an integral conductor for splitting a widely varying current to be sampled into fixed and predetermined fractions thereof, comprising:
   opposite terminal ends;

a first major current path extending between said terminal ends;

a second major current path extending between said terminal ends;

and a shunting current path having a fixed cross-sectional area and extending between a first fixed and predetermined point on said first major current path and a second fixed and predetermined point on said second major current path, said first and second points being displaced from a null position and having slightly different voltage potentials, a predetermined fraction of said current to be sampled flows in said shunting current path in response to said different voltage potentials of said first and second points, said predetermined fractional value of current flows independently of the ratio of the cross-sectional areas of said current paths such that said current flowing in said shunting current path is increased by increasing said displacement from said null position and decreased by decreasing said displacement from said null position.

2. The current divider of claim 1 wherein the first major current path and the second major current path have equal lengths and equal cross-sectional areas.

3. The current divider of claim 2 wherein the first major current path together with the second major current path form a rectangular conductive path.

4. The current divider of claim 2 wherein the first major current path together with the second major current path form a circular conductive path.

5. The current divider of claim 4 wherein the shunting current path extends between a point substantially eight degrees below the midpoint of the first major current path and a point substantially eight degrees above the midpoint of the second major current path.

6. The current divider of claim 1 wherein the shunting current path has a cross-sectional area comparable to the cross-sectional areas of both the first major current path and the second major current path.

7. A current divider formed by two integral conductors for splitting two currents to be sampled into fixed and predetermined fractions thereof, comprising: a first set of opposite terminal ends; a first major current path semicircular in shape and extending between said first opposite terminal ends; a second major current path semicircular in shape and having a length and a cross-sectional area equal to said first major current path and extending between said first opposite terminal ends such that said second major current path together with said first major current path form a circular conductive path; a first shunting current path having a cross-sectional area comparable to said first major current path and extending between a point substantially eight degrees below the midpoint of said first major current path and a point substantially eight degrees above the midpoint of said second major current path such that a relatively small predetermined fraction of one of said currents to be sampled flows in said first shunting path without the need for a correspondingly small ratio of the cross-sectional area of said first shunting current path to the cross-sectional areas of said first and second major current paths; a second set of opposite terminal ends in insulated relationship from said first set of opposite terminal ends; a third major current path semicircular in shape and extending between said second opposite terminal ends, having a length and a cross-sectional area equal to said first major current path and in insulated relationship therefrom; a fourth major current path semicircular in shape and extending between said second opposite terminal ends such that said fourth major current path together with said third major current path form a circular conductive path, and having a length and a cross-sectional area equal to said first major current path and in insulated relationship from said second major current path; and a second shunting current path having a cross-sectional area comparable to said first major current path and in insulated relationship from said first shunting current path and further, extending between a point substantially eight degrees below the midpoint of said third major current path and a point substantially eight degrees above the midpoint of said fourth major current path such that a relatively small predetermined fraction of said other of said currents to be sampled flows in said second shunting current path without the need for a correspondingly small ratio of the cross-sectional area of said second shunting current path to the cross-sectional areas of said third and fourth major current paths.

8. The current divider of claim 7 being mounted in a meter for measurement of electrical parameters.

* * * * *